United States Patent
Kim et al.

(10) Patent No.: US 8,963,096 B2
(45) Date of Patent: *Feb. 24, 2015

(54) X-RAY DETECTOR INCLUDING OXIDE SEMICONDUCTOR TRANSISTOR

(75) Inventors: Sun-il Kim, Osan-si (KR); Jae-chul Park, Suwon-si (KR); Sang-wook Kim, Yongin-si (KR); Chang-jung Kim, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 256 days.

This patent is subject to a terminal disclaimer.

(21) Appl. No.: 12/926,921

(22) Filed: Dec. 17, 2010

(65) Prior Publication Data

US 2011/0240869 A1 Oct. 6, 2011

(30) Foreign Application Priority Data

Mar. 30, 2010 (KR) ........................ 10-2010-0028616

(51) Int. Cl.
*H01L 27/146* (2006.01)
*G01T 1/24* (2006.01)
*H01L 31/08* (2006.01)

(52) U.S. Cl.
CPC ................ *H01L 31/085* (2013.01); *G01T 1/24* (2013.01)
USPC ............ 250/370.09; 250/370.12; 250/370.13; 250/370.14

(58) Field of Classification Search
USPC ............................ 250/370.08, 370.09, 370.14
See application file for complete search history.

(56) References Cited

U.S. PATENT DOCUMENTS

| 4,236,829 | A | * | 12/1980 | Chikamura et al. | ........ 257/183.1 |
| 5,737,050 | A | * | 4/1998 | Takahara et al. | .............. 349/122 |
| 5,994,713 | A |   | 11/1999 | Becker et al. | |
| 6,025,599 | A |   | 2/2000 | Lee et al. | |
| 7,186,985 | B2 |   | 3/2007 | Iwanczyk et al. | |
| 7,323,692 | B2 | * | 1/2008 | Rowlands et al. | ....... 250/370.09 |
| 7,405,408 | B2 |   | 7/2008 | Vogtmeier et al. | |
| 7,435,968 | B2 |   | 10/2008 | Watanabe et al. | |

(Continued)

FOREIGN PATENT DOCUMENTS

| EP | 1120833 A2 | 8/2001 |
| EP | 1120833 A3 | 8/2001 |

(Continued)

OTHER PUBLICATIONS

U.S. Office Actiond dated Sep. 24, 2013, in co-pending U.S. Appl. No. 12/923,553.

(Continued)

*Primary Examiner* — Casey Bryant
(74) *Attorney, Agent, or Firm* — Harness, Dickey & Pierce P.L.C.

(57) ABSTRACT

Example embodiments are directed an X-ray detector including an oxide semiconductor transistor. The X-ray detector including the oxide semiconductor transistor includes an oxide semiconductor transistor and a signal storage capacitor in parallel to each other on a substrate. The oxide semiconductor transistor includes a channel formed of an oxide semiconductor material, and a photoconductor. A pixel electrode and a common electrode are formed on opposite surfaces of the photoconductor. The channel includes ZnO, or a compound including ZnO and at least one selected from a group consisting of gallium (Ga), indium (In), hafnium (Hf), and tin (Sn).

19 Claims, 4 Drawing Sheets

(56) References Cited

U.S. PATENT DOCUMENTS

| | | |
|---|---|---|
| 7,576,327 B2 | 8/2009 | Okada |
| 7,589,324 B2 | 9/2009 | Chen et al. |
| 7,709,804 B2 | 5/2010 | Sakamoto et al. |
| 7,834,324 B2* | 11/2010 | Imai .................. 250/370.14 |
| 7,872,237 B2 | 1/2011 | Puhakka et al. |
| 8,497,483 B2 | 7/2013 | Puhakka et al. |
| 2001/0008271 A1 | 7/2001 | Ikeda et al. |
| 2002/0145116 A1* | 10/2002 | Choo et al. .............. 250/370.09 |
| 2003/0021382 A1 | 1/2003 | Iwanczyk et al. |
| 2004/0127038 A1* | 7/2004 | Carcia et al. .................. 438/689 |
| 2004/0178426 A1* | 9/2004 | Melekhov et al. ............ 257/233 |
| 2004/0256569 A1 | 12/2004 | Tokuda |
| 2005/0178970 A1 | 8/2005 | Amemiya et al. |
| 2005/0184320 A1* | 8/2005 | Green et al. .................. 257/290 |
| 2006/0054835 A1 | 3/2006 | Rowlands et al. |
| 2006/0158095 A1* | 7/2006 | Imamura .................... 313/500 |
| 2006/0192087 A1 | 8/2006 | Kuszpet et al. |
| 2007/0114430 A1* | 5/2007 | Imai et al. ............... 250/370.09 |
| 2008/0087835 A1 | 4/2008 | Okada |
| 2009/0026379 A1 | 1/2009 | Yaegashi et al. |
| 2009/0026382 A1* | 1/2009 | Sakamoto et al. ....... 250/370.09 |
| 2009/0110144 A1* | 4/2009 | Takahashi et al. ............ 378/62 |
| 2009/0152664 A1 | 6/2009 | Klem et al. |
| 2010/0044711 A1 | 2/2010 | Imai |
| 2011/0049375 A1 | 3/2011 | Kameshima et al. |
| 2011/0156273 A1 | 6/2011 | Puhakka et al. |
| 2011/0240869 A1 | 10/2011 | Kim et al. |
| 2011/0309259 A1 | 12/2011 | Kim et al. |
| 2012/0146016 A1 | 6/2012 | Park et al. |
| 2012/0181440 A1 | 7/2012 | Kim et al. |
| 2012/0223241 A1 | 9/2012 | Kim et al. |

FOREIGN PATENT DOCUMENTS

| | | |
|---|---|---|
| EP | 1978563 A2 | 10/2008 |
| EP | 1978563 A3 | 10/2012 |
| JP | 01-114782 A | 5/1989 |
| JP | 08289886 A | 11/1996 |
| JP | 2005183454 A | 7/2005 |
| JP | 2006-049773 A | 2/2006 |
| JP | 2007-324470 A | 12/2007 |
| JP | 2009-031159 A | 2/2009 |
| JP | 2009-032854 A | 2/2009 |
| JP | 2009-131564 A | 6/2009 |
| KR | 100767384 B1 | 10/2007 |
| KR | 10-2008-0105518 | 12/2008 |
| KR | 10-2009-0131773 | 12/2009 |
| KR | 10-2010-0044451 | 4/2010 |
| WO | WO-2004/038810 A2 | 5/2004 |
| WO | WO-2004/038810 A3 | 5/2004 |

OTHER PUBLICATIONS

Extended European Search Report dated Feb. 7, 2014, issued in Application No. 11192248.0.

U.S. Office Action dated Sep. 24, 2013, in copending U.S. Appl. No. 12/923,553.

U.S. Office Action dated Aug. 22, 2013, in copending U.S. Appl. No. 13/247,512.

Nov. 13, 2014, Office Action issued in related U.S. Appl. No. 12/923,553.

* cited by examiner

X-RAY DETECTOR INCLUDING OXIDE SEMICONDUCTOR TRANSISTOR

CROSS-REFERENCE TO RELATED APPLICATIONS

This application claims priority under 35 U.S.C. §119 to Korean Patent Application No. 10-2010-0028616, filed on Mar. 30, 2010, in the Korean Intellectual Property Office, the disclosure of which is incorporated herein in its entirety by reference.

BACKGROUND

1. Field

Example embodiments relate to apparatuses for X-ray detectors that directly generate electric charges by using photoconductors, include oxide semiconductor transistors using oxide semiconductors as channels, and method of manufacturing the x-ray detectors.

2. Description of the Related Art

X-ray detectors using thin film transistors (TFTs) are used as diagnostic X-ray detectors, for example. An X-ray detector outputs an X-ray image or an X-ray penetration image captured by using X-ray(s) as a digital signal. The X-ray detector may use a direct method or an indirect method.

In the direct method, X-rays are converted directly into electric charges by a photoconductor. In the indirect method, X-rays are converted into visible light by a scintillator, and then the converted visible light is converted into electric charges by a light conversion device such as a photodiode.

An X-ray detector using the direct method includes pixels that are arranged in an array. Each pixel includes a photoconductor, a capacitor (a storage unit), and/or a switching transistor. The photoconductor generates electron-hole pairs in response to X-rays irradiated thereon. Electric charges (electrons or holes) are stored in the capacitor as a result of an electric field applied to the photoconductor. When the switching transistor is turned-on, the electric charges stored in the capacitor are transferred to a signal processor, and then an image signal from the corresponding pixel is measured. As a result of processing the image signal, a digital image is formed.

In order to achieve good image information, an off-current of a transistor needs to be low. Since amorphous silicon channel used in the transistor has a relatively high off-current, electric charges stored in the capacitor may leak. In relatively high off-current, electric charges stored in the capacitor may leak. In addition, since the amorphous silicon channel has a relatively low charge mobility of around 0.5 cm$^2$/Vs, a speed for transmitting a large amount of information may be reduced. When a polysilicon channel is used, although the charge mobility is increased, an off-current of the transistor may still be relatively high, manufacturing processes of the polysilicon channel may be complicated, and manufacturing costs may be increase.

SUMMARY

According the example embodiments, an X-ray detector includes an oxide semiconductor transistor and a signal storage capacitor parallel to each other on a substrate, the oxide semiconductor transistor including a channel of an oxide semiconductor material; a pixel electrode on an upper electrode of the signal storage capacitor and connected to the upper electrode; a photoconductor on the pixel electrode; a common electrode on the photoconductor; and a signal processor connected to a drain electrode of the oxide semiconductor transistor.

According the example embodiments, the X-ray detector, further includes a gate electrode of the oxide semiconductor transistor and a lower electrode of the signal storage capacitor on the substrate; a first insulating layer on the gate electrode and the lower electrode; the channel of the oxide semiconductor transistor on the first insulating layer; a drain electrode and a source electrode of the oxide semiconductor transistor, the drain electrode, source electrode and the upper electrode of the signal storage capacitor being on the first insulating layer; and a connection wiring connecting the source electrode and the upper electrode.

According the example embodiments, the X-ray detector, further includes a second insulating layer on the oxide semiconductor transistor and the signal storage capacitor; and a contact hole through the pixel electrode, the contact hole connecting the pixel electrode to the signal storage capacitor.

According the example embodiments, the channel includes ZnO, or a compound including ZnO and at least one selected from a group consisting of gallium (Ga), indium (In), hafnium (Hf), and aluminum (Al).

According to the example embodiments, the channel is an oxide channel including SnO2.

According to the example embodiments, the channel is a compound including SnO2 and at least one selected from a group consisting of gallium (Ga), indium (In), hafnium (Hf), and aluminum (Al).

According the example embodiments, the photoconductor includes at least one selected from a group consisting of amorphous selenium (a-Se), HgI2, PbI2, CdTe, CdZnTe, PbO, TlBr, and a-Si.

According the example embodiments, the X-ray detector further includes a first diffusion-prevention layer between the pixel electrode and the photoconductor.

According the example embodiments, the first diffusion-prevention layer is of a conductive polymer or a conductive oxide semiconductor.

According the example embodiments, the first diffusion-prevention layer has a thickness of about 0.1 μm to about 100 μm.

According the example embodiments, the conductive oxide semiconductor includes a compound including ZnO or ZnO and at least one selected from a group consisting of gallium (Ga), indium (In), hafnium (Hf), and tin (Sn).

According the example embodiments, the X-ray detector further includes a second diffusion-prevention layer between the common electrode and the photoconductor.

According the example embodiments, the second diffusion-prevention layer has a thickness of about 100 A° to about 500 A°.

According the example embodiments, a method of manufacturing an X-ray detector includes forming an oxide semiconductor transistor and a signal storage capacitor in parallel to each other on a substrate; forming a pixel electrode on an upper electrode of the signal storage capacitor and connected to the upper electrode of the signal storage capacitor; forming a photoconductor on the pixel electrode; and forming a common electrode on the photoconductor.

According the example embodiments, the method further includes forming a gate electrode of the oxide semiconductor transistor and a lower electrode of the signal storage capacitor on a substrate; forming a first insulating layer on the gate electrode and the lower electrode; forming a channel of the oxide semiconductor transistor on the first insulating layer; forming a drain electrode and a source electrode of the oxide semiconductor transistor, and the upper electrode of the signal storage capacitor; and connecting the source electrode and the upper electrode by a connection wiring.

According the example embodiments, the method further includes forming a second insulating layer on the oxide semiconductor transistor and the signal storage capacitor; and connecting the pixel electrode to the signal storage capacitor.

According the example embodiments, the method further includes forming a first diffusion-prevention layer on the pixel electrode; and forming a second diffusion-prevention layer on the photoconductor.

According the example embodiments, the method further includes forming the first diffusion-prevention layer of a conductive polymer or a conductive oxide semiconductor.

According the example embodiments, the method further includes forming the first diffusion-prevention layer having a thickness of about 0.1 µm to about 100 µm.

According the example embodiments, the method further includes forming the second diffusion-prevention layer having a thickness of about 100 A° to about 500 A°.

BRIEF DESCRIPTION OF THE DRAWINGS

The above and other features and advantages will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION

Figure 1:
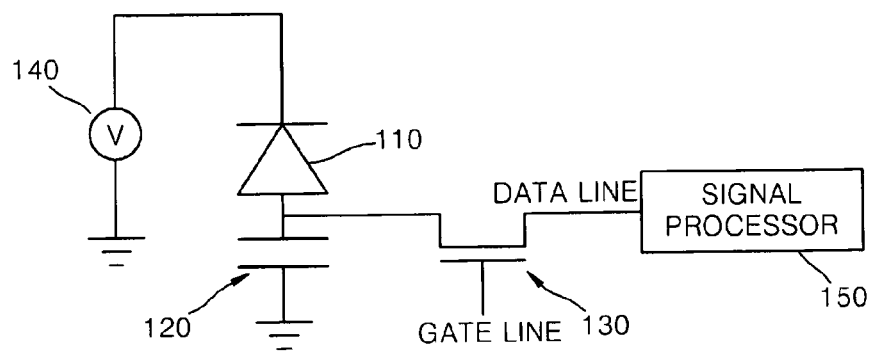
FIG. 1 is a circuit diagram of an X-ray detector including an oxide semiconductor transistor according to example embodiments.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising," "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 is a circuit diagram of an X-ray detector including an oxide semiconductor transistor according to example embodiments. The X-ray detector includes a plurality of pixels arranged in an array, and FIG. 1 is a circuit diagram of one such pixel of the X-ray detector.

Referring to FIG. 1, the X-ray detector includes a photoconductor 110, and a signal storage capacitor 120 and a switching transistor 130 that are connected in parallel to the photoconductor 110. A voltage source 140 applies a direct current (DC) voltage to the photoconductor 110 for generating an electric field. The switching transistor 130 is turned-on though a gate line, and accordingly, electric charges stored in the signal storage capacitor 120 are transferred to a signal processor 150 through a data line.

Figure 2:
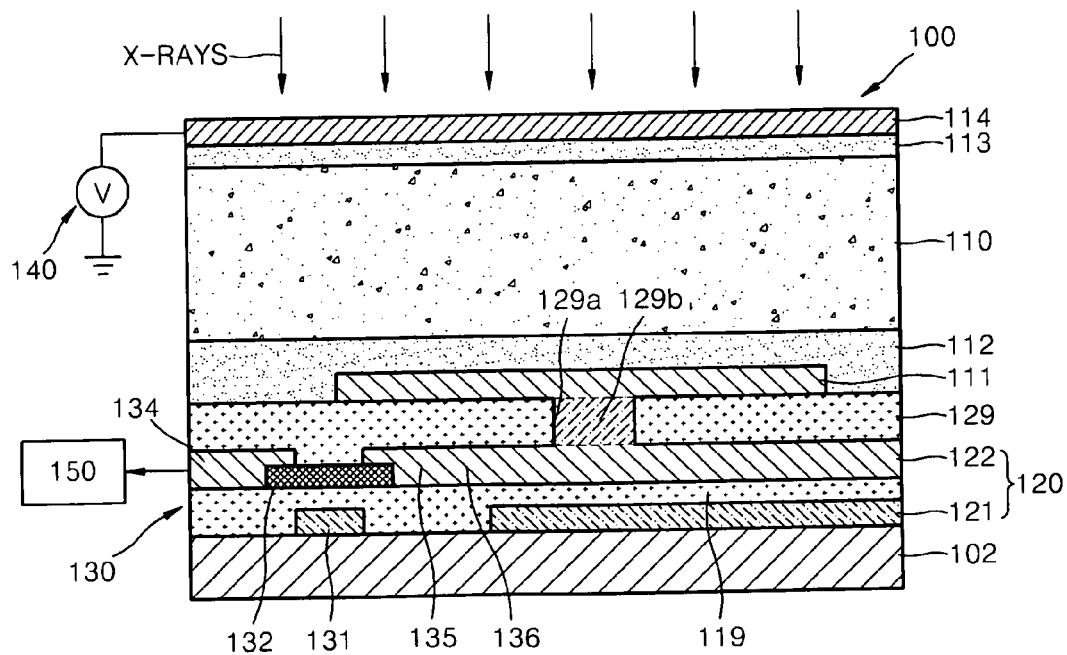
FIG. 2 is a schematic cross-sectional view of the X-ray detector of FIG. 1.

FIG. 2 is a cross-sectional view of the X-ray detector 100 of FIG. 1. The same reference numerals as those in FIG. 1 refer to the same elements as in FIG. 1, and thus their detailed description will not be repeated.

Referring to FIG. 2, the signal storage capacitor 120 and the switching transistor 130 are connected in series on a substrate 102. The photoconductor 110 is disposed above the signal storage capacitor 120.

The substrate 102 may be formed of glass, silicon, plastic, a combination thereof or the like. A gate electrode 131 of the switching transistor 130, and a lower electrode 121 of the signal storage capacitor 120 are disposed on the substrate 102. The gate electrode 131 and the lower electrode 121 may be formed of the same material. The gate line (see FIG. 1) is connected to the gate electrode 131, but is not illustrated in FIG. 2.

On the substrate 102, a first insulating layer 119 is formed on the gate electrode 131 and the lower electrode 121. The first insulating layer 119 may be formed of silicon nitride, silicon oxide, silicon oxynitride, alumina, hafnium oxide, a combination thereof or the like. The first insulating layer 119 acts as a gate oxide on the gate electrode 131, and acts as a capacitor dielectric on the lower electrode 121. Alternatively, the gate oxide and the capacitor dielectric may be formed of different materials, and then, a process for forming a thin film and an etching process may be additionally required.

A channel 132 is formed as an active layer on the first insulating layer 119 so as to correspond to the gate electrode 131. The channel 132 may be formed of ZnO, $SnO_2$, a ZnO-based semiconductor, and/or a $SnO_2$-based semiconductor. The ZnO-based semiconductor may be a compound formed by mixing ZnO with gallium (Ga), indium (In), hafnium (Hf), tin (Sn), a combination thereof or the like. The $SnO_2$-based semiconductor may be a compound formed by mixing $SnO_2$ with gallium (Ga), indium (In), hafnium (Hf), aluminum (Al), a combination thereof or the like. Examples of the ZnO-based semiconductor may include InZnO, GaInZnO, HfInZnO, SnZnO, and SnInZnO. Examples of the $SnO_2$-based semiconductor may include $InSnO_2$, $GaSnO_2$, and $HfSnO_2$.

A metal layer covering both ends of the channel 132 is formed on the first insulating layer 119. The metal layer covering both ends of the channel 132 includes a drain electrode 134, a source electrode 135, a connection wiring 136 extending from the source electrode 135, and an upper electrode 122 of the signal storage capacitor 120 connected to the source electrode 135 through the connection wiring 136. The upper electrode 122 is formed so as to correspond to the lower electrode 121, and the upper electrode 122 and the first insulating layer 119 formed between the upper electrode 122 and the lower electrode 121 constitute the signal storage capacitor 120.

The drain electrode 134 is connected to the signal processor 150 through the data line (see FIG. 1). The signal processor 150 quantifies/measures/processes electric charges from the data line of each pixel, and produces an image of each pixel.

A second insulating layer 129 is formed on the upper electrode 122, the drain electrode 134 and the source electrode 135. The second insulating layer 129 may be a passivation layer. The second insulating layer 129 and the first insulating layer 119 may be formed of the same material, or different materials. A contact hole 129a is formed in the second insulating layer 129, and the contact hole 129a is filled with a conductive plug 129b. The conductive plug 129b may be formed of aluminum (Al), molybdenum (Mo), a combination thereof or the like.

A pixel electrode 111, the photoconductor 110, and a common electrode 114 are sequentially formed on the second insulating layer 129. A first diffusion-prevention layer 112 is formed between the photoconductor 110 and the pixel electrode 111. A second diffusion-prevention layer 113 may be further formed between the photoconductor 110 and the common electrode 114.

A DC voltage is applied to the common electrode 114 from the voltage source 140. A positive or negative voltage is applied to the common electrode 114 according to a material of the photoconductor 110. When an electric charge stored in the signal storage capacitor 120 transferred from the photoconductor 110 is a hole, a positive voltage is applied to the pixel electrode 111. When an electric charge stored in the signal storage capacitor 120 from the photoconductor 110 is an electron, a negative voltage is applied to the pixel electrode 111.

The common electrode 114 and the photoconductor 110 are each formed to have a relatively flat shape (for example, in a shape of a layer) to cover a plurality of pixels. The pixel electrode 111 is formed to correspond to a single pixel. The switching transistor 130 and the signal storage capacitor 120 are also formed to correspond to each pixel. Thus, the X-ray detector 100 includes pixels arranged in an array. FIGS. 1 and 2 are a circuit diagram and a structural diagram that correspond to each pixel, respectively.

The photoconductor 110 may be formed of amorphous selenium (a-Se), $HgI_2$, $PbI_2$, CdTe, CdZnTe, PbO, TlBr, and/or a-Si. $HgI_2$ and $PbI_2$ have relatively excellent properties for detecting X-rays as compared to a-Se. However, since $HgI_2$ and $PbI_2$ have great reactivity with the pixel electrode 111 and the common electrode 114 compared to a-Se, elements of $HgI_2$ and $PbI_2$ may penetrate into the pixel electrode 111 and the common electrode 114, and accordingly the photoconductor 110 may not function efficiently.

The first diffusion-prevention layer 112 may be formed of a conductive polymer, a conductive oxide semiconductor, and/or the like. Examples of the conductive oxide semiconductor may include ZnO, $SnO_2$, a ZnO-based semiconductor, and/or a $SnO_2$-based semiconductor. The ZnO-based semiconductor may be a compound formed by mixing ZnO with gallium (Ga), indium (In), hafnium (Hf), tin (Sn), and/or the like. Examples of the ZnO-based semiconductor may include InZnO, GaInZnO, HfInZnO, SnZnO, and SnInZnO. The $SnO_2$-based semiconductor may be a compound formed by mixing $SnO_2$ with gallium (Ga), indium (In), hafnium (Hf), aluminum (Al), and/or the like. Examples of the $SnO_2$-based semiconductor may include $InSnO_2$, $GaSnO_2$, and $HfSnO_2$.

The first diffusion-prevention layer 112 is formed in a thickness of about 0.1 to about 100 μm. When the thickness of the first diffusion-prevention layer 112 is less than 0.1 μm, a dark current may increase, and the first diffusion-prevention layer 112 may function relatively poorly in preventing diffusion. When the thickness of the first diffusion-prevention layer 112 is greater than 100 μm or more, a total series resistance may increase, and accordingly, a voltage at the photoconductor 110 may be reduced, thus reducing the sensitivity of the photoconductor 110.

The second diffusion-prevention layer 113 may be formed of a conductor or a nonconductor. The second diffusion-prevention layer 113 may be formed of a polymer, an oxide semiconductor, silicon oxide, silicon oxynitride, alumina, hafnium oxide, and/or the like.

The second diffusion-prevention layer 113 is formed to a thickness of about 100 to about 1000 A°. When the thickness of the second diffusion-prevention layer 113 is less than 100 A°, a dark current may increase, and the second diffusion-prevention layer 113 may function relatively poorly in preventing diffusion. When the thickness of the second diffusion-prevention layer 113 is greater than 1000 A°, a total series resistance may increase, and accordingly, a voltage at the photoconductor 110 may be reduced, thus reducing the sensitivity of the photoconductor 110.

A DC voltage applied to the common electrode 114 may vary according to a material of the photoconductor 110 and the thickness of the photoconductor 110. The thickness of the photoconductor 110 may vary according to a subject of measurement. For example, if the photoconductor 110 is formed of $HgI_2$, the thickness of the photoconductor 110 may be in the range of about 300 to about 800 μm, for example, when chest is imaged/measured, and the thickness of the photoconductor 110 may be in the range of about 100 to about 300 μm, for example, when breast is imaged/measured. When the photoconductor 110 is formed of a-Se, the thickness of the photoconductor 110 is in the range of about 900 to about 1000 μm, for example, when chest is imaged/measured, and the thickness of the photoconductor 110 is in the range of about 300 to about 500 μm, for example, when breast is imaged. When the photoconductor 110 is formed of a-Se, a voltage of about 10 V/μm is applied to the common electrode 114. When the photoconductor 110 is formed of $HgI_2$, a voltage of about 0.5 V/μm is applied to the common electrode 114.

Hereinafter, with reference to FIGS. 1 and 2, an operation of the X-ray detector 100 will be described.

X-rays that pass through the common electrode 114 and the second diffusion-prevention layer 113 is absorbed by the photoconductor 110, and electron-hole pairs are generated in the photoconductor 110. The amount of electron-hole pairs may vary according to energy of the X-rays absorbed by the photoconductor 110. When a first DC voltage is applied to the common electrode 114, electrons and holes are separated from each other. When the photoconductor 110 is formed of $HgI_2$, holes flow towards the pixel electrode 111, and then are accumulated in the signal storage capacitor 120. When the switching transistor 130 is turned-on, electric charges (holes) stored in the signal storage capacitor 120 are transferred to the signal processor 150 through the drain electrode 134. The signal processor 150 measures X-ray transmittance of an imaged/measured subject by using the amount of transferred electric charges so as to produce an image obtained from each pixel.

Since the switching transistor 130 including the channel 132 formed of an oxide semiconductor has a smaller off-current than that of a transistor including an a-Si channel, the electric charges stored in the signal storage capacitor 120 may be prevented from leaking. In addition, since a signal-to-noise ratio of the switching transistor 130 is small compared to the case of the transistor including an a-Si channel, an image may be produced with greater reliability. The channel 132 formed of an oxide semiconductor may smaller in size than the a-Si channel, and accordingly an aperture ratio at each pixel may be increased. Due to the increase in the aperture ratio, the size of the X-ray detector 100 may be reduced, and the sensitivity of the X-ray detector 100 may be improved.

FIGS. 3A through 3F are cross-sectional views of a method of manufacturing the X-ray detector of FIG. 2, according example embodiments.

Figure 3A:
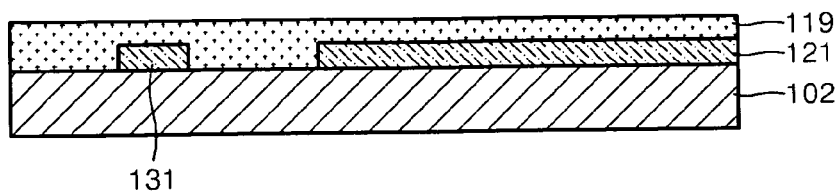
FIGS. 3A through 3F are cross-sectional views of a method of manufacturing the X-ray detector of FIG. 2, according to example embodiments.

Referring to FIG. 3A, a metal layer (not shown) is formed on a substrate 102. The metal layer is patterned to form a gate electrode 131, and a lower electrode 121 of a signal storage capacitor. Simultaneously or in a later step, the gate line (see FIG. 1) connected to the gate electrode 131 is also formed.

Then, a first insulating layer 119 covering the gate electrode 131 and the lower electrode 121 is formed on the substrate 102. The first insulating layer 119 acts as a gate oxide on the gate electrode 131, and acts as a dielectric on the lower electrode 121.

Figure 3B:
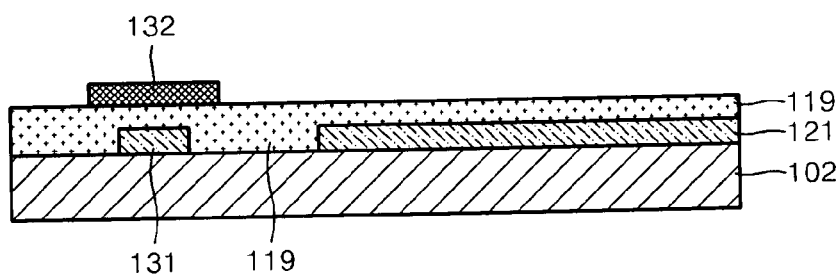

Referring to FIG. 3B, an oxide semiconductor (not shown) is deposited on the first insulating layer 119, and then the oxide semiconductor is patterned to form a channel 132. The first insulating layer 119 may be formed of silicon nitride, silicon oxide, silicon oxynitride, alumina, hafnium oxide, and/or the like. The oxide semiconductor may be formed of ZnO, $SnO_2$, a ZnO-based semiconductor, and/or a $SnO_2$-based semiconductor. The ZnO-based semiconductor may be a compound formed by mixing ZnO with gallium (Ga), indium (In), hafnium (Hf), tin (Sn), and/or the like. Examples of the ZnO-based semiconductor may include InZnO, GaInZnO, HfInZnO, SnZnO, and SnInZnO. The $SnO_2$-based semiconductor may be a compound formed by mixing $SnO_2$ with gallium (Ga), indium (In), hafnium (Hf), aluminum (Al), and/or the like. Examples of the $SnO_2$-based semiconductor may include $InSnO_2$, $GaSnO_2$, and $HfSnO_2$.

Figure 3C:
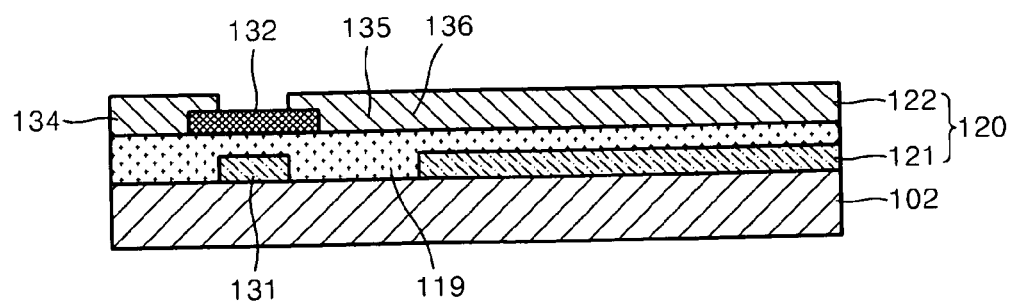

Referring to FIG. 3C, a metal layer (not shown) is formed to cover the channel 132 on the first insulating layer 119, and then the metal layer is patterned to form the drain electrode 134, the source electrode 135, and the upper electrode 122 of the signal storage capacitor 120. Simultaneously or in a later step, a connection wiring 136 is also formed between the source electrode 135 and the upper electrode 122. Simultaneously or in a later step, a data line (see FIG. 1) connected to the drain electrode 134 may be formed.

Figure 3D:
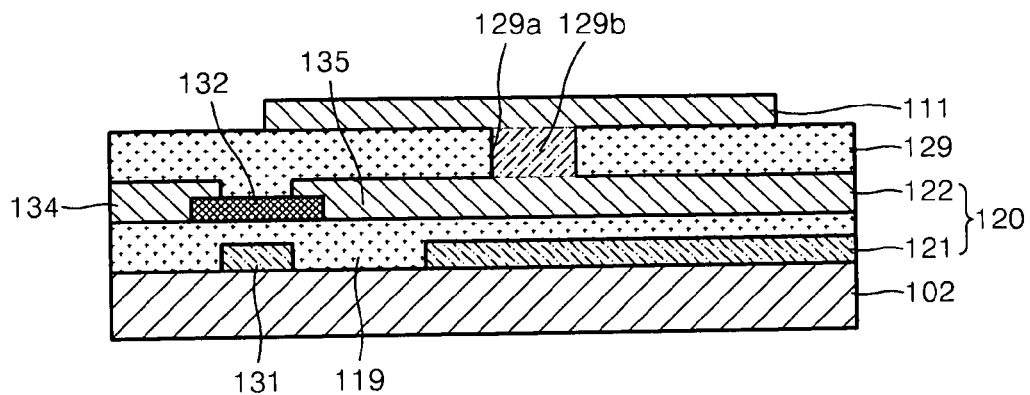

Referring to FIG. 3D, a second insulating layer 129 as a passivation layer is formed on the substrate 102. The second insulating layer 129 and the first insulating layer 119 may be formed of the same material or different materials. Then, a contact hole 129a is formed through the second insulating layer 129, thereby exposing the upper electrode 122. Then, the contact hole 129a is filled with a conductive plug 129b. The conductive plug 129b may be formed of aluminum (Al), molybdenum (Mo), and/or the like.

Then, a metal layer (not shown) is formed on the second insulating layer 129, and the metal layer is patterned to form a pixel electrode 111 connected to the conductive plug 129b.

Figure 3E:
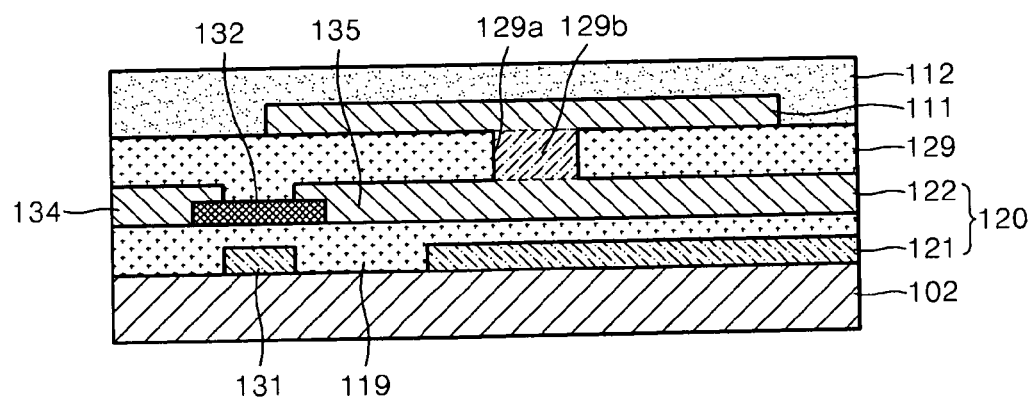

Referring to FIG. 3E, the first diffusion-prevention layer 112 covering the pixel electrode 111 is formed on the second insulating layer 129 to a thickness of about 0.1 to about 100 μm. The first diffusion-prevention layer 112 may be formed of a conductive polymer, a conductive oxide semiconductor, and/or the like. Examples of the conductive oxide semiconductor may include ZnO, $SnO_2$, a ZnO-based semiconductor, or a $SnO_2$-based semiconductor. The ZnO-based semiconductor may be a compound formed by mixing ZnO with gallium (Ga), indium (In), hafnium (Hf), tin (Sn), and/or the like. Examples of the ZnO-based semiconductor may include InZnO, GaInZnO, HfInZnO, SnZnO, and SnInZnO. The $SnO_2$-based semiconductor may be a compound formed by mixing $SnO_2$ with gallium (Ga), indium (In), hafnium (Hf), aluminum (Al), and/or the like. Examples of the $SnO_2$-based semiconductor may include $InSnO_2$, $GaSnO_2$, and $HfSnO_2$.

Figure 3F:
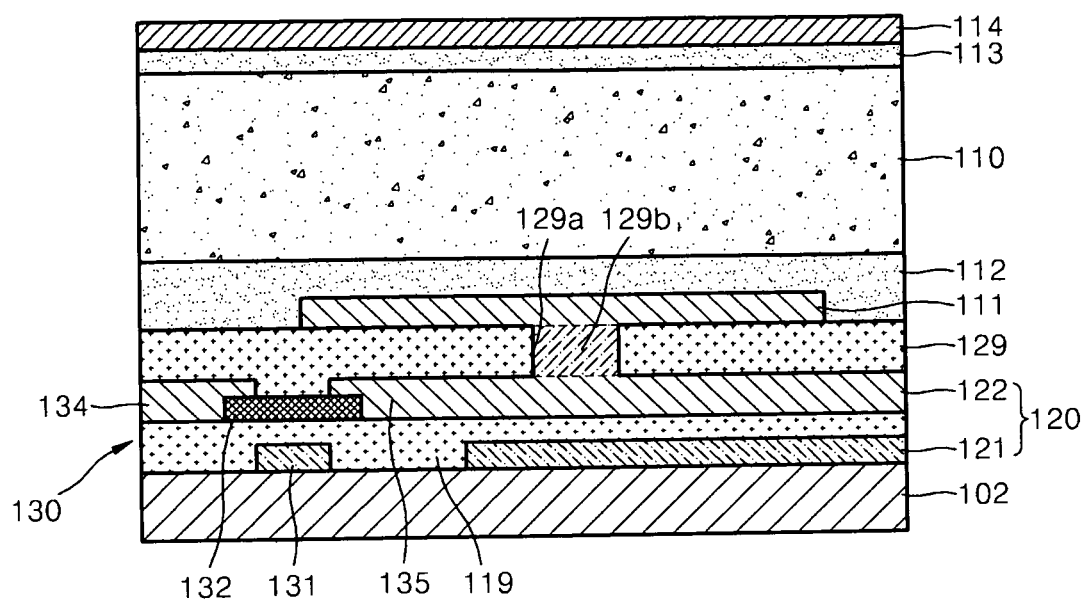

Referring to FIG. 3F, a photoconductor 110, a second diffusion-prevention layer 113, and a common electrode 114 are sequentially stacked on the first diffusion-prevention layer 112.

The photoconductor 110 may be formed of amorphous selenium (a-Se), $HgI_2$, $PbI_2$, CdTe, CdZnTe, PbO, and/or TlBr. The thickness of the photoconductor 110 may vary according to a subject that measured/imaged. For example, if the photoconductor 110 is formed of $HgI_2$, the thickness of the photoconductor 110 may be in the range of about 300 to about 800 μm, for example, when a chest is imaged/measured, and the thickness of the photoconductor 110 may be in the range of about 150 to about 300 μm, for example, when breast is measured/imaged. When the photoconductor 110 is formed of a-Se, the thickness of the photoconductor 110 may be in the range of about 900 to about 1000 μm, for example, when a chest is imaged/measured, and the thickness of the photoconductor 110 is in the range of about 300 to about 500 μm, for example, when breast is imaged/measured.

The second diffusion-prevention layer 113 may be formed of a conductor or a nonconductor. The second diffusion-prevention layer 113 may be formed of a polymer, an oxide semiconductor, silicon oxide, silicon oxynitride, alumina, hafnium oxide, and/or the like.

As described above, according to example embodiments, an X-ray detector including an oxide semiconductor transistor uses an oxide semiconductor channel, and thus electric charges stored in a capacitor are prevented from leaking. In addition, due to a small signal-to-noise ratio of the oxide semiconductor transistor, an image may be produced with greater reliability. In addition, the oxide semiconductor channel may have a smaller size than an a-Si channel, and accordingly, an aperture ratio at each pixel may be increased. Thus, due to the increase in the aperture ratio, the size of the X-ray detector may be reduced, and the sensitivity of the X-ray detector may be improved.

Example embodiments are not limited to the structure disclosed above. For example, according to example embodiments, the X-ray detector may include a plurality of oxide semiconductor transistors, photoconductors and/or signal storage capacitors. According to example embodiments, the X-ray detector may detect X-ray of different energies. According to example embodiments, the X-ray detector may include blocking layer(s) between the transistor and the source of X-rays that protect the transistor from damage due to the X-rays. Further, the position and structure of the switching transistor may not be limited to the example embodiments disclosed above. For example, the switching transistor may be inverted, wherein its gate electrode is between the source of X-rays and the channel. Alternatively, the transistor may be flipped, wherein its source is connected to the signal processor. According to example embodiments. The transistor may be inverted and flipped. Similarly, when the X-ray detector includes a plurality of transistors, some of the transistors may be inverted and/or flipped with respect to the other transistors.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. An X-ray detector, comprising:
a substrate;
an oxide semiconductor transistor on the substrate, the oxide semiconductor transistor including a source electrode, a gate electrode, a drain electrode, and a channel of an oxide semiconductor material;
a signal storage capacitor on the substrate, the signal storage capacitor including an upper electrode and a lower electrode;
a pixel electrode on the upper electrode and connected to the upper electrode;
a first diffusion-prevention layer on the pixel electrode;
a photoconductor on the first diffusion-prevention layer;
a common electrode on the photoconductor; and
a signal processor connected to the drain electrode;
wherein the oxide semiconductor transistor and the signal storage capacitor are parallel to each other on the substrate,
wherein the first diffusion-prevention layer is of a conductive polymer or a conductive oxide semiconductor, and
wherein the first diffusion-prevention layer prevents diffusion of constituents of the photoconductor into the pixel electrode.

2. The X-ray detector of claim 1, further comprising:
a first insulating layer on the gate electrode and the lower electrode;
the source electrode, the drain electrode, the channel, and the upper electrode on the first insulating layer; and
a connection wiring connecting the source electrode and the upper electrode.

3. The X-ray detector of claim 1, further comprising:
a second insulating layer on the oxide semiconductor transistor and the signal storage capacitor; and
a contact hole through the second insulating layer, the contact hole connecting the pixel electrode to the signal storage capacitor.

4. The X-ray detector of claim 1, wherein the channel comprises ZnO, or a compound including ZnO and at least one selected from a group consisting of gallium (Ga), indium (In), hafnium (Hf), and aluminum (Al).

5. The X-ray detector of claim 1, wherein the channel is an oxide channel comprising $SnO_2$, or a compound including $SnO_2$ and at least one selected from a group consisting of gallium (Ga), indium (In), hafnium (Hf), and aluminum (Al).

6. The X-ray detector of claim 1, wherein the photoconductor includes at least one selected from a group consisting of amorphous selenium (a-Se), $HgI_2$, $PbI_2$, CdTe, CdZnTe; PbO, TlBr, and amorphous silicon (a-Si).

7. The X-ray detector of claim 1, wherein the first diffusion-prevention layer has a thickness of about 0.1 μm to about 100 μm.

8. The X-ray detector of claim 1, wherein the conductive oxide semiconductor comprises a compound including ZnO, or ZnO and at least one selected from a group consisting of gallium (Ga), indium (In), hafnium (Hf), and tin (Sn).

9. The X-ray detector of claim 1, further comprising a second diffusion-prevention layer between the common electrode and the photoconductor.

10. The X-ray detector of claim 9, wherein the second diffusion-prevention layer has a thickness of about 100 A° to about 500 A°.

11. An X-ray detector, comprising:
a substrate;
an oxide semiconductor transistor on the substrate, the oxide semiconductor transistor including a source electrode, a gate electrode, a drain electrode, and a channel of an oxide semiconductor material;
a signal storage capacitor on the substrate, the signal storage capacitor including an upper electrode and a lower electrode;
a pixel electrode on the upper electrode and connected to the upper electrode;
a first diffusion-prevention layer on the pixel electrode;
a photoconductor on and in contact with the first diffusion-prevention layer;
a common electrode on the photoconductor; and
a signal processor connected to the drain electrode;
wherein the oxide semiconductor transistor and the signal storage capacitor are parallel to each other on the substrate,
wherein the first diffusion-prevention layer is of a conductive polymer or a conductive oxide semiconductor, and
wherein the first diffusion-prevention layer prevents diffusion of constituents of the photoconductor into the pixel electrode.

12. The X-ray detector of claim 11, further comprising:
a first insulating layer on the gate electrode;
wherein the source electrode, the drain electrode, and the channel are on the first insulating layer.

13. The X-ray detector of claim 11, further comprising:
a first insulating layer on the lower electrode;
wherein the upper electrode is on the first insulating layer.

14. The X-ray detector of claim 11, further comprising:
a first insulating layer on the gate electrode and the lower electrode;
wherein the source electrode, the drain electrode, the channel, and the upper electrode are on the first insulating layer.

15. An X-ray detector, comprising:
a substrate;
an oxide semiconductor transistor on the substrate, the oxide semiconductor transistor including a source electrode, a gate electrode, a drain electrode, and a channel of an oxide semiconductor material;

a signal storage capacitor on the substrate, the signal storage capacitor including an upper electrode and a lower electrode;

a pixel electrode on the upper electrode and connected to the upper electrode;

a first diffusion-prevention layer on the pixel electrode;

a photoconductor on the first diffusion-prevention layer;

a second diffusion-prevention layer on and in contact with the photoconductor;

a common electrode on the second diffusion-prevention layer; and a signal processor connected to the drain electrode;

wherein the oxide semiconductor transistor and the signal storage capacitor are parallel to each other on the substrate, wherein the first diffusion-prevention layer is of a conductive polymer or a conductive oxide semiconductor, and wherein the first diffusion-prevention layer prevents diffusion of constituents of the photoconductor into the pixel electrode.

16. The X-ray detector of claim 15, further comprising:
a first insulating layer on the gate electrode;
wherein the source electrode, the drain electrode, and the channel are on the first insulating layer.

17. The X-ray detector of claim 15, further comprising:
a first insulating layer on the lower electrode;
wherein the upper electrode is on the first insulating layer.

18. The X-ray detector of claim 15, further comprising:
a first insulating layer on the gate electrode and the lower electrode;
wherein the source electrode, the drain electrode, the channel, and the upper electrode are on the first insulating layer.

19. The X-ray detector of claim 15, wherein the photoconductor is on and in contact with the first diffusion-prevention layer.

* * * * *